(12) United States Patent
Yan et al.

(10) Patent No.: US 7,812,344 B2
(45) Date of Patent: Oct. 12, 2010

(54) THIN FILM TRANSISTOR

(75) Inventors: Jing-Yi Yan, Taoyuan County (TW);
Liang-Hsiang Chen, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/372,700

(22) Filed: Feb. 17, 2009

(65) Prior Publication Data

US 2010/0127270 A1 May 27, 2010

(30) Foreign Application Priority Data

Nov. 24, 2008 (TW) ............................. 97145335 A

(51) Int. Cl.
*H01L 51/00* (2006.01)
(52) U.S. Cl. ................. 257/40; 257/57; 257/66

(58) Field of Classification Search .................. 257/40, 257/57, 66
See application file for complete search history.

(56) References Cited

U.S. PATENT DOCUMENTS

2005/0001210 A1    1/2005   Lee et al.
2005/0026083 A1    2/2005   Ron

*Primary Examiner*—Long Pham
(74) *Attorney, Agent, or Firm*—Jianq Chyun IP Office

(57) ABSTRACT

A thin film transistor is provided. The thin film transistor includes a gate, at least one inorganic material layer, at least one dielectric layer, a source, a drain and an active layer. The gate is disposed on the substrate. The inorganic material layer covers the gate. The dielectric layer including at least one organic material covers the substrate and has an opening exposing the inorganic material layer on the gate. The source and the drain are disposed on the dielectric layer and a part of the inorganic layer exposed by the opening respectively. A channel region exists between the source and the drain. The active layer is disposed on the channel region.

13 Claims, 10 Drawing Sheets

THIN FILM TRANSISTOR

CROSS-REFERENCE TO RELATED APPLICATION

This application claims the priority benefit of Taiwan application serial no. 97145335, filed on Nov. 24, 2008. The entirety of the above-mentioned patent application is hereby incorporated by reference herein and made a part of specification.

BACKGROUND OF THE INVENTION

1. Field of the Invention

The present invention generally relates to a transistor and a method for fabricating the same, in particular, to a thin film transistor and the method for fabricating the same.

2. Description of Related Art

With growth of the technologies, lighter, thinner, portable and flexible displays have drawn attention of many people, and many big companies have joined the development of such displays. Currently, most of the flexible displays use organic materials to fabricate the insulating layers. For example, the technology has been disclosed in US Patent Application No. 2005/0001210 and US Patent Application No. 2005/0026083. The insulating layer made of an organic material is highly flexible, but often has a low dielectric constant. Further, the quality of the insulating layer is difficult to control, and defects in a thin film cannot be controlled effectively. Therefore, a leakage current easily occurs in a transistor, resulting in unstable characteristics of the transistor.

To improve the dielectric characteristics of the organic material, particles having a high dielectric constant can be added into the organic material by means of hybrid, which, however, increases the roughness of the surface of the organic insulating layer, and increases the retardation effect.

SUMMARY OF THE INVENTION

Accordingly, the present invention is related to a thin film transistor. The thin film transistor includes a gate, at least an inorganic material layer, at least a dielectric layer, a source, a drain, and an active layer. The gate is disposed on a substrate. The inorganic material layer covers the gate. The dielectric layer at least including an organic material covers the substrate, and has an opening exposing the inorganic material layer on the gate. The source and the drain are disposed on the dielectric layer and a part of the inorganic layer exposed by the opening. A channel region exists between the source and the drain. The active layer is disposed on the channel region.

The present invention is also related to a thin film transistor. The thin film transistor includes a gate, at least an inorganic material layer, at least one dielectric layer, a source, a drain, and an active layer. The active layer is located on the substrate. The source and the drain cover a part of the active layer and a part of the substrate. A channel region exists between the source and the drain. The inorganic material layer is filled into the channel region. The dielectric layer at least including an organic material covers the inorganic material, the source and the drain. The gate is disposed on the dielectric layer.

The present invention is further related to a thin film transistor. The thin film transistor includes a gate, an insulating layer, a source, a drain, and an active layer. The source and the drain are disposed above the substrate. A channel region exists between the source and the drain. The gate is disposed opposite to the channel region. The active layer is disposed opposite to the gate, and is disposed in an active region of the substrate. The insulating layer isolates the gate from the source and the drain. The insulating layer includes an inorganic material layer and a dielectric layer. The inorganic material is at least disposed between the gate and the active layer. The dielectric layer at least including an organic material is at least disposed on the substrate outside the active region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
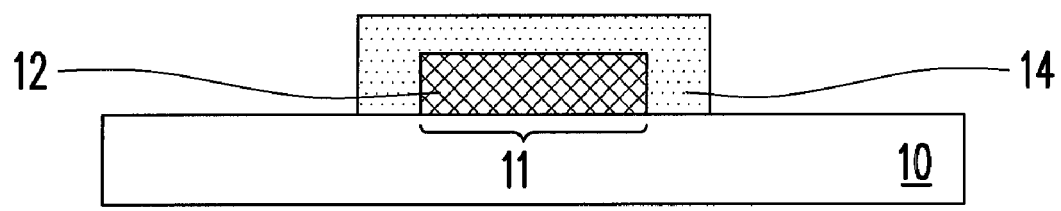
FIGS. 1 to 4 are schematic cross-sectional views of a method for fabricating a bottom-contact thin film transistor with a bottom gate according to embodiments of the present invention.

Reference will now be made in detail to the present embodiments of the invention, examples of which are illustrated in the accompanying drawings. Wherever possible, the same reference numbers are used in the drawings and the description to refer to the same or like parts.

An insulating layer of the present invention includes an inorganic material layer and a dielectric layer. The inorganic layer is disposed between a gate and an active layer. The dielectric layer is at least disposed at a position requiring insulation outside an active region. The bottom-contact thin film transistor with the bottom gate and the top-contact thin film transistor with the top gate are taken for example in the following illustration. However, the present invention is not limited to be so, and the present invention is also applicable to a top-contact thin film transistor with a bottom gate, a bottom-contact thin film transistor with a top gate, and other thin film transistors.

FIGS. 1 to 4 are schematic cross-sectional views of the method for fabricating a bottom-contact thin film transistor with a bottom gate according to embodiments of the present invention.

Referring to FIG. 1, the method for fabricating a thin film transistor according to this embodiment includes forming a gate 12 in the active region 11 of the substrate 10. The substrate 10 can be a rigid substrate or a flexible substrate. The material of the rigid substrate can be glass, quartz, or silicon wafer for example. The material of the flexible of the substrate can be plastic such as acrylic, metal foil, or paper. The active region 11 is a region preset to form the active layer. The method for forming the gate 12 includes forming a gate material layer, and then patterning the gate material layer through a lithographic and etching process for example. The material of the gate material layer includes metal, doped polysilicon, or transparent conductive oxide. For example, the metal is gold, silver, aluminum, copper, chromium or alloy thereof, and the transparent conductive oxide is indium tin oxide. For example, the method for forming the gate material layer is a physical vapor deposition process or chemical vapor deposition process. For example, the physical vapor deposition is a sputtering process or an evaporation process. In another embodiment, the method for forming the gate 12 can be forming a patterned conductive layer directly, for example, through an ink jet process.

Then, an inorganic material layer 14 is formed on the substrate 10 to cover the gate 12. The method for forming the inorganic material layer 14 is, for example, forming a blanket inorganic material layer first, and then patterning the inorganic material layer through a lithographic and etching process. The inorganic material layer 14 can be a monolayer or multilayer structure. Each layer in the inorganic material layer 14 with the multilayer structure can be formed by a single material or multiple materials. The material of the inorganic material layer 14 includes a low dielectric constant material having a dielectric constant lower than 4 or a high dielectric constant material having a dielectric constant higher than 4, such as a silicon oxide ($SiO_x$), a silicon oxynitride ($SiON_x$), a silicon nitride ($SiN_x$), an aluminum oxide ($AlO_x$), an aluminum nitride ($AlN_x$), a hafnium oxide ($HfO_x$), a hafnium silicon oxide ($HfSiO_x$), a hafnium lanthanum oxide ($HfLaO_x$), or a silicon carbide ($SiC_x$), where x represents various possible values. A thickness of the inorganic material layer 14 is for example, 100 to 5000 angstroms.

Figure 2:
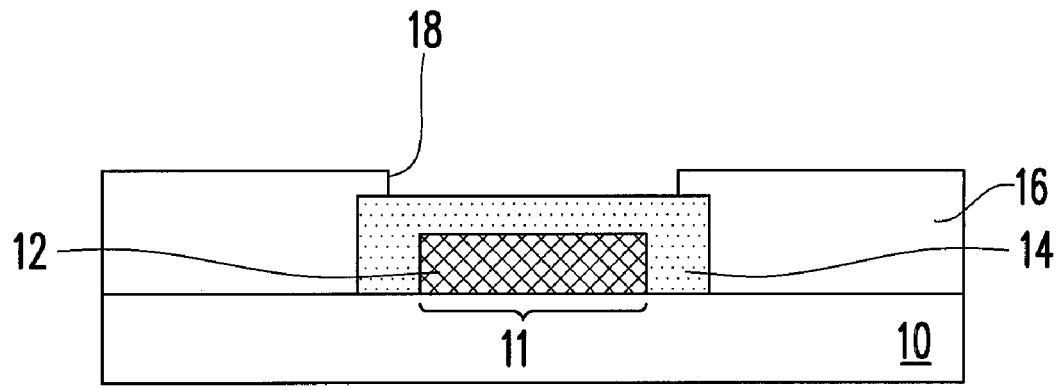

Then, referring to FIG. 2, the dielectric layer 16 is formed on the substrate 10, and has an opening 18 exposing the inorganic material layer 14 on the gate 12. The insulating layer 17 is formed by the dielectric layer 16 and the inorganic material layer 14. The dielectric layer 16 can be a monolayer or multilayer structure. The dielectric layer 16 can be made of an organic material, such as an organic material having a dielectric constant lower than 4. Furthermore, the material of each layer in the dielectric layer 16 can be formed of a single organic material, multiple organic materials, or include both organic and inorganic materials. The material of the dielectric layer 16 can be a photosensitive or non-photosensitive material, such as polyimide (PI), polyvinyl phenol, polystyrene (PS), acrylic or epoxy resin.

In an embodiment, the material of the dielectric layer 16 is a photosensitive material. The method for forming the dielectric layer 16 is for example, forming a blanket photosensitive material layer through the physical vapor deposition such as evaporation or through a coating process, then performing a lithographic process to pattern the photosensitive material layer. In another embodiment, the material of the dielectric layer 16 can be a non-photosensitive material. The method for forming the dielectric layer 16 is for example, forming a blanket non-photosensitive material layer through the physical vapor deposition such as evaporation or through a coating process, then performing a lithographic and etching process to pattern the non-photosensitive material layer. A thickness of the dielectric layer 16 can be adjusted as desired. In an embodiment, a thickness of the dielectric layer 16 is for example, 200 to 20000 angstroms.

Figure 3:
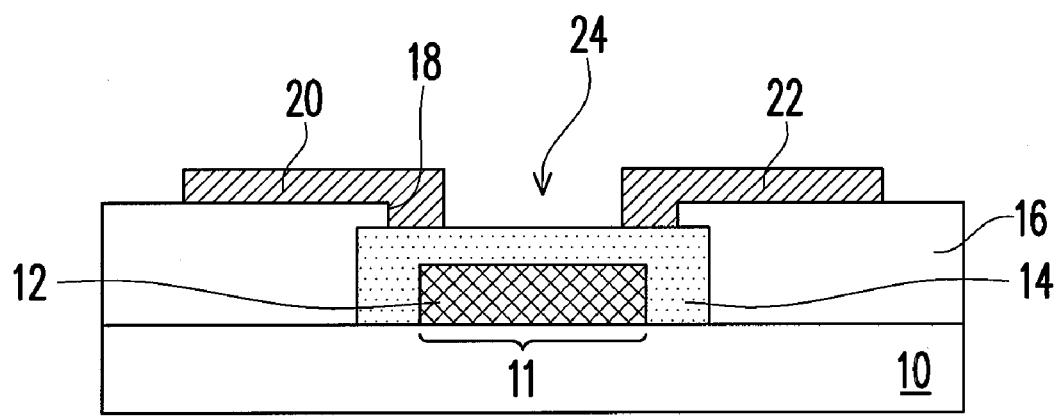

Then referring to FIG. 3, a source 20 and a drain 22 are formed on the dielectric layer 16 and the part of the inorganic material layer 14 exposed by the opening 18. A channel region 24 is between the source 20 and the drain 22. The method for forming the source 20 and the drain 22 is e.g., forming a conductive material layer first, and then patterning the conductive material layer. The material of the conductive material layer is for example, metal such as gold, silver, aluminum, copper, chromium or an alloy thereof. The method for forming the conductive material layer includes performing a physical vapor deposition process, which is for example, a sputtering process or an evaporation process. In another embodiment, the method for forming the source 20 and the drain 22 can also be forming the patterned conductive layer directly, for example, through an ink jet process.

Figure 4:
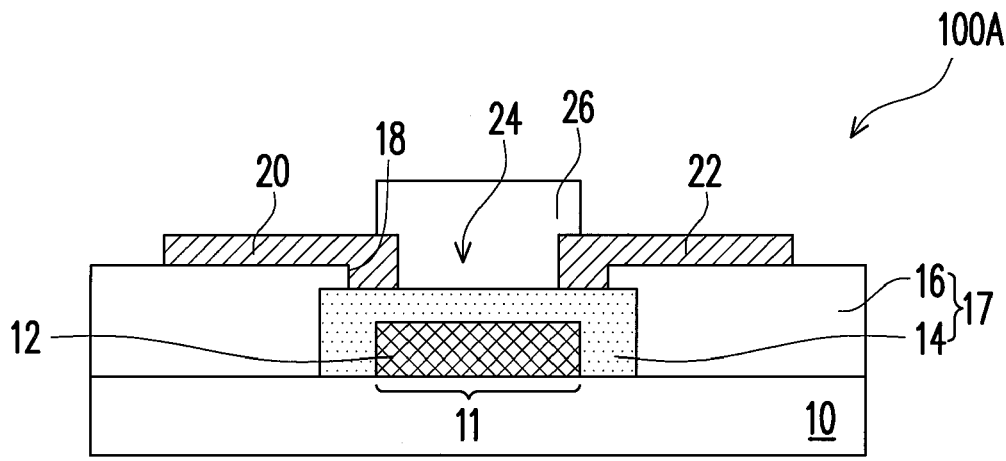

Then, referring FIG. 4, an active layer 26 is formed in the channel region 24. The active layer 26 is electrically coupled to the source 20 and the drain 22. The material of the active layer 26 is for example, semiconductor or organic semiconductor. The semiconductor is for example, amorphous silicon, polysilicon or oxide semiconductor series. The organic semiconductors include N-type or P-type organic small molecular semiconductors, organic polymer semiconductors, or a mixture of the organic small molecular and organic polymer semiconductors. The material of the organic small molecular semiconductors is for example, pentacene or tetracene. The organic polymer semiconductor is for example, poly-(3-hexylthiophene) (P3HT). Thus, the fabrication of the thin film transistor with the bottom gate 100 A is completed.

Referring to FIG. 4, in short, the thin film transistor 100 A of this embodiment includes a gate 12, at least an inorganic material layer 14, at least a dielectric layer 16, a source 20, a drain 22, and an active layer 26. The gate 12 is disposed in the active region 11 on the substrate 10. The inorganic material layer 14 covers the gate 12 and exposes the substrate 10. The dielectric layer 16 covers the substrate 10, and has an opening 18 exposing the inorganic material layer 14 on the gate 12. The inorganic material layer 14 and the dielectric layer 16 form the insulating layer 17 which isolates the gate 12 from the active layer 26. The source 20 and the drain 22 are disposed on the dielectric layer 16 and the part of the inorganic material layer 14 exposed by the opening 18 respectively. The channel region 24 is between the source 20 and the drain 22. The active layer 26 is disposed in the channel region 24.

Figure 4A:
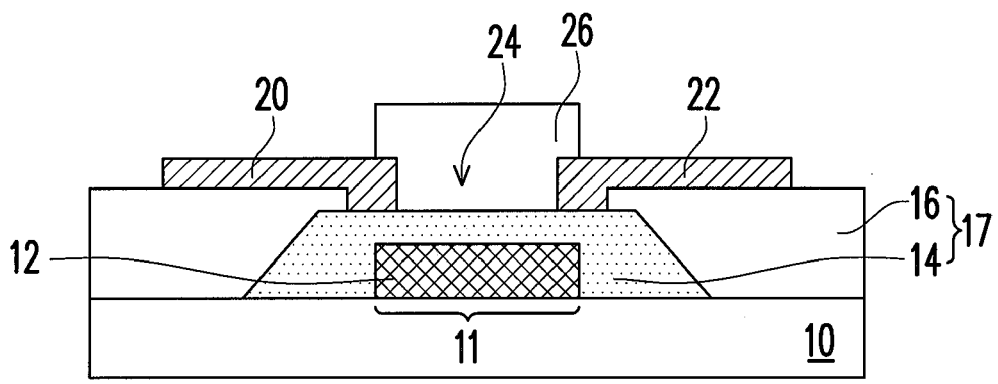
FIGS. 4A, 4B, and 4I to 4K are schematic cross-sectional views of various bottom-contact thin film transistors with the bottom gate according to the embodiments of the present invention.
Figure 4B:
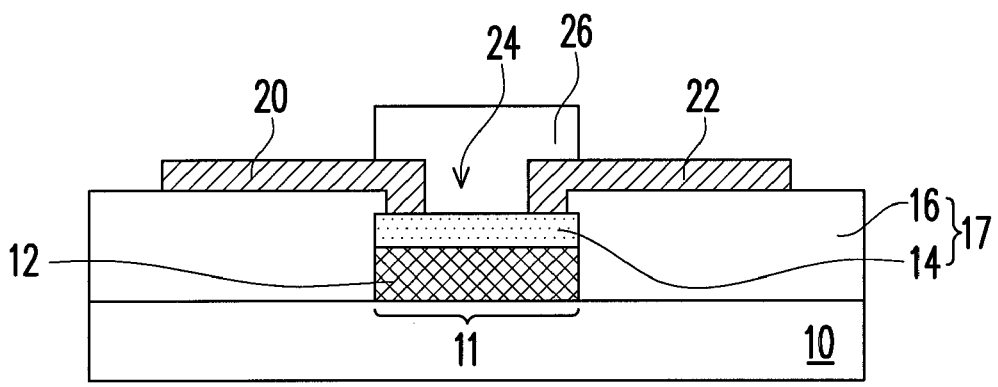

Referring to FIG. 4, in this embodiment, the inorganic material layer 14 is disposed in the active region 11 and extends to the edge of the active region 11 to conformally cover the top surface and the sidewalls of the gate 12. In another embodiment, referring to FIG. 4A, as such, the inorganic material layer 14 is also disposed in the active region 11 and extends to the edge of the active region 11 to cover the top surface and the sidewalls of the gate 12. The sides of the inorganic material layer 14 are in a trapezoid shape to reduce the stress. In another embodiment, referring to FIG. 4B, the inorganic material layer 14 may also be disposed in only the active region 11, cover the top surface of the gate 12, but do not cover the sides of the gate 12.

Figure 4C:
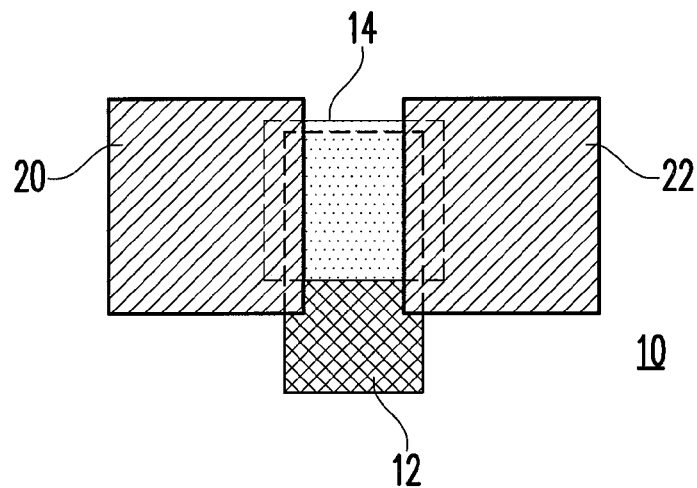
FIGS. 4C to 4H are top views of various bottom-contact thin film transistors with the bottom gate according to the embodiments of the present invention.
Figure 4D:
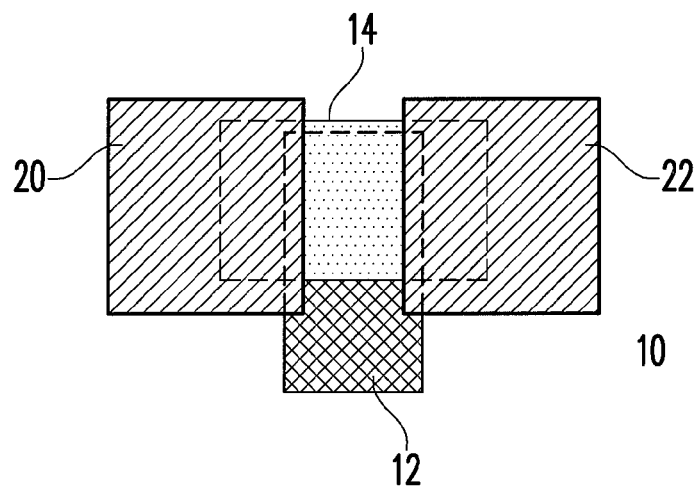
Figure 4E:
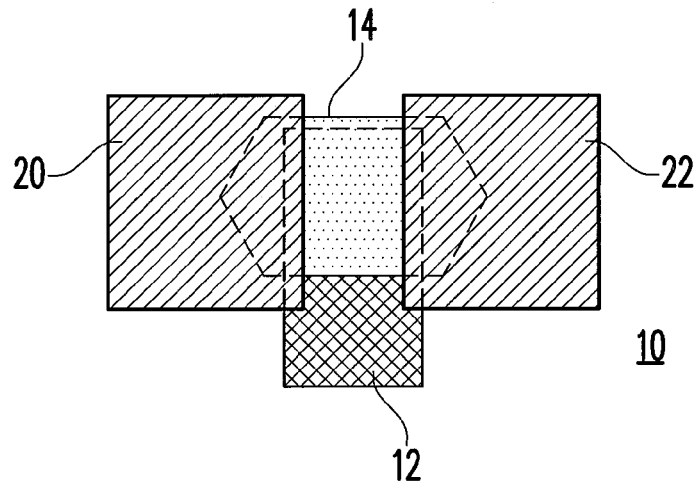
Figure 4F:
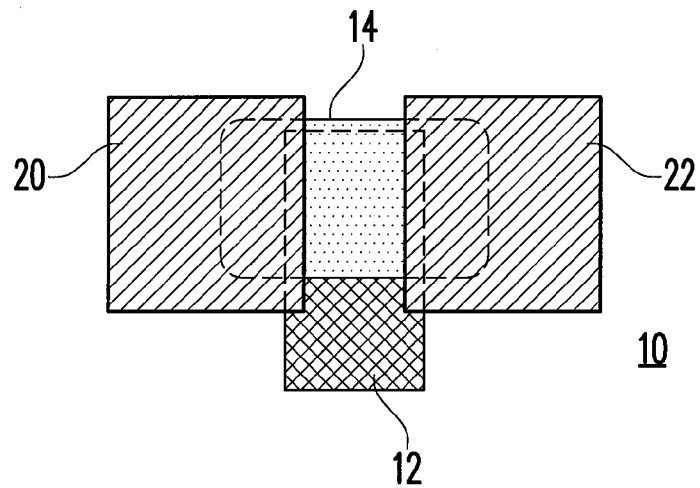
Figure 4G:
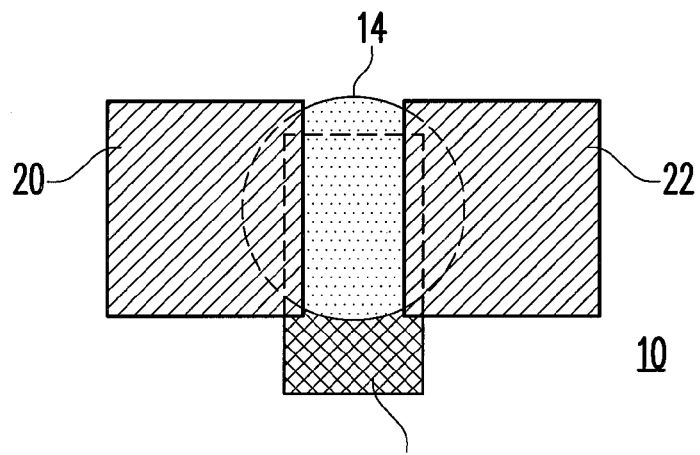
Figure 4H:
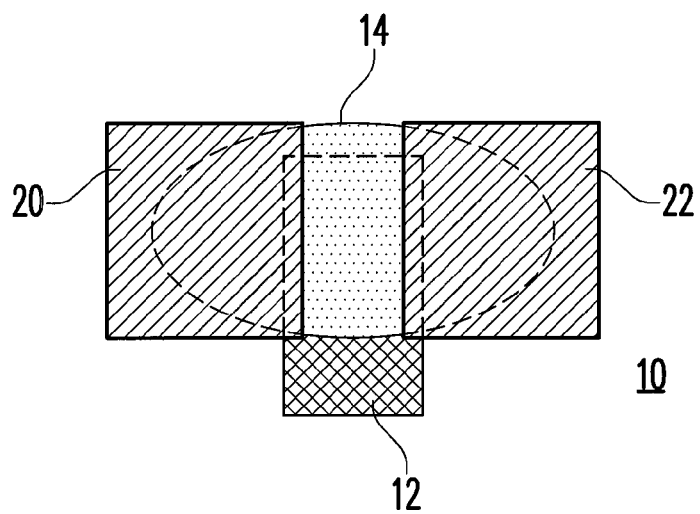

Furthermore, the profile of the top surface of the inorganic material layer 14 can be any shape, such as square, rectangle, or polygon. FIGS. 4C, 4D, and 4E are top views of the thin film transistor respectively. Alternatively, to reduce the stress generated by bending, the profile of the top surface of the inorganic material layer 14 can be designed to be curve, such as a square having arc angles, a rectangle having arc angles, a polygon having arc angles, a circle, or an ellipse. FIGS. 4F, 4G, and 4H are top views of the profile of a rectangle having four arc angles, a circle, and an ellipse of the top surface of the inorganic material layer 14 of the thin film transistor respectively. However, the profile of the inorganic material layer 14 is not limited to be so in the present invention, but can be designed to any shape that reduces the stress generated by bending. For the clarity of the figures, the dielectric layer 16 and the active layer 26 are not shown in FIGS. 4C to 4H.

Figure 4I:
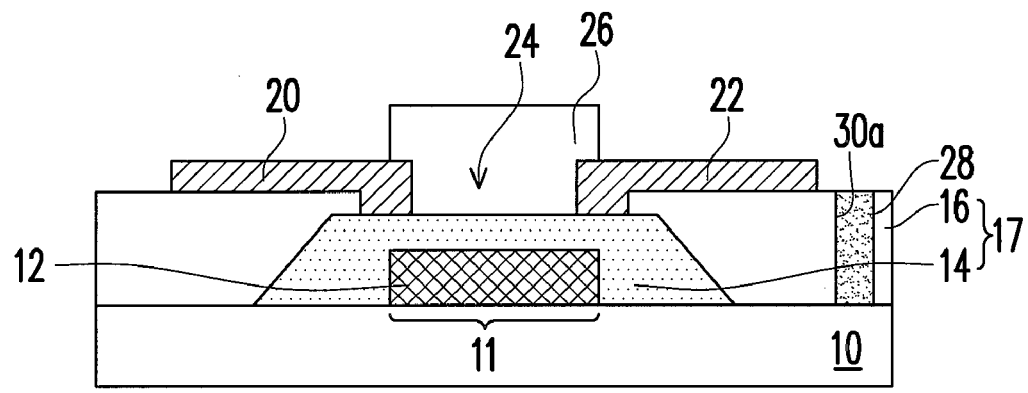
Figure 4J:
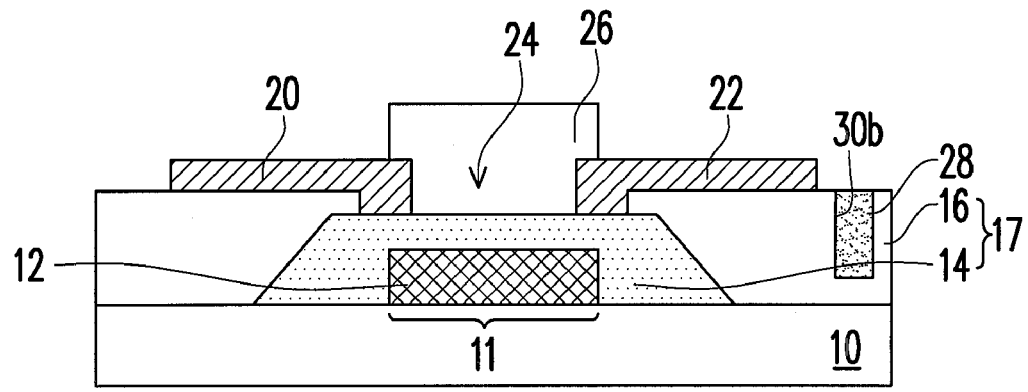
Figure 4K:
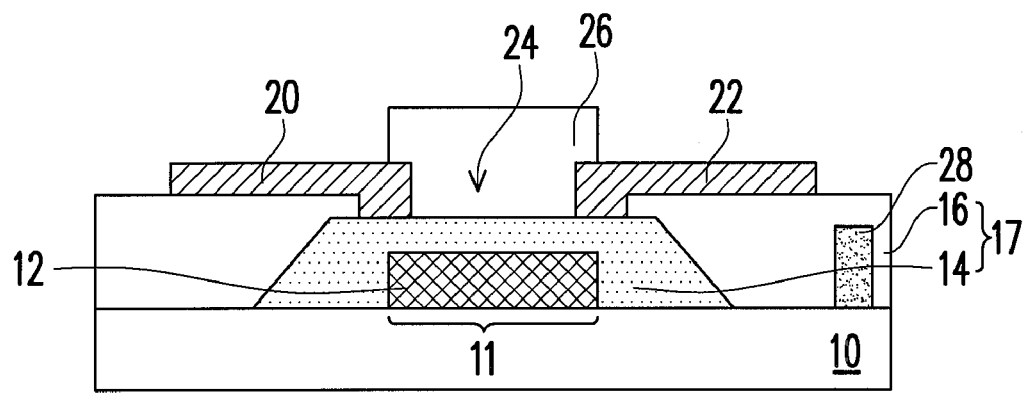

Referring to FIGS. 4I, 4J, 4K, to further absorb the stress, at least an elastomer is formed in the dielectric layer 16 outside the source 20 and the drain 22. The material of the elastomer 28 can be a polymer having a Flexural modulus, Young's modulus or tensile modulus lower than that of the dielectric layer 16. In an embodiment, the polymer functioning as the elastomer 28 can be a polymer having a tensile modulus greater than that of the dielectric layer 16 but smaller than 5000 MPa, for example, from 1300 MPa to 3790 MPa. In another embodiment, the polymer functioning as the elastomer 28 can be a polymer having a Young's modulus smaller than that of the dielectric layer 16. The material of the elastomer is for example, poly(amide imide), poly(benzimidazole), poly(bis maleimide), poly(benzobisthiazole), poly(butylene terephthalate), polycarbonate, polychloral, poly(2,6-dimethyl-1,4-phenylene oxide), poly(ether ether ketone), poly(ether imide), poly(ether sulfone), poly(ethylene-2,6-naphthalate), poly(ethylene sulfide), poly(ethylene terephthalate), poly(lactic acid), poly(methylene oxide), poly(m-ethyl methacrylate), or poly(4-methyl pentene-1).

Referring to FIG. 4I, in an embodiment, the elastomer 28 extends from the bottom surface of the dielectric layer 16 to the top surface of the dielectric layer 16. The method for forming the elastomer 28 is for example, forming another opening 30a at the same time as forming the opening 18 in the dielectric layer 16. The opening 30a exposes the substrate 10, and then the polymer is backfilled in the opening 30a. Referring to FIG. 4J, in another embodiment, the elastomer 28 extends from the top surface of the dielectric layer into the dielectric layer. The method for forming the elastomer 28 in FIG. 4J is for example, forming another opening 30b at the same time as forming the opening 18 in the dielectric layer 16. The opening 30b does not expose the substrate 10, and then the polymer is backfilled in the opening 30b. Referring to FIG. 4K, in another embodiment, the elastomer 28 extends from the bottom surface of the dielectric layer 16 into the dielectric layer 16, but not to the top surface of the dielectric layer 16. The method for forming the elastomer 28 of FIG. 4K is for example, forming the polymer layer on the substrate 10 before forming the dielectric layer 16, then patterning the polymer layer.

FIGS. 5 to 8 are schematic cross-sectional views of the method for fabricating a top-contact thin film transistor with the top gate according to another embodiment of the present invention. The material of the components of the thin film transistor and the method for forming the same in the following may use the material and the method for the components having the same reference numbers disclosed above, which will not be described in detail again.

Figure 5:
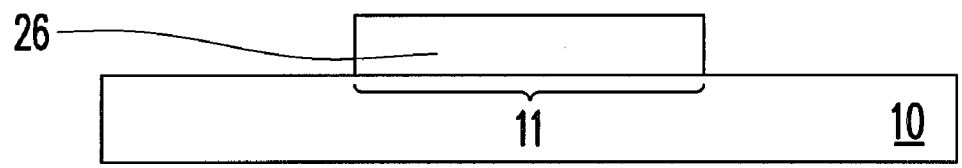
FIGS. 5 to 8 are schematic cross-sectional views of a method for fabricating various top-contact thin film transistors with a top gate according to the embodiments of the present invention.
Figure 6:
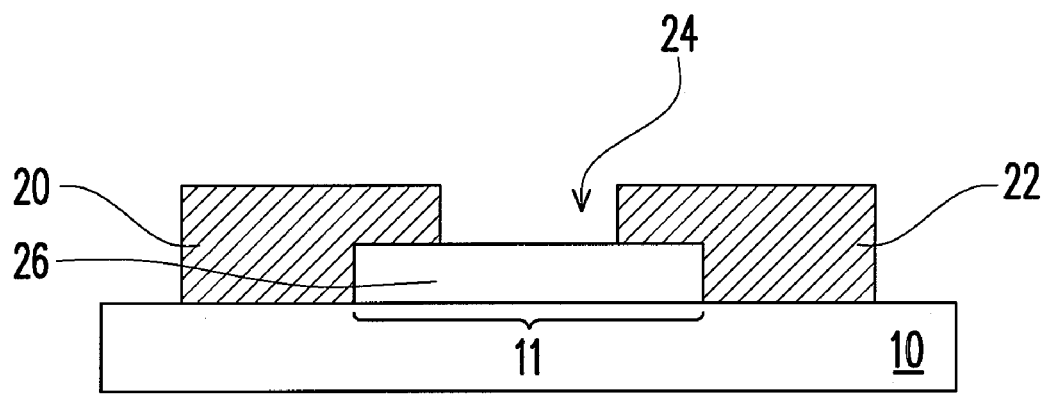

Referring to FIG. 5, the active layer 26 is formed in the active region 11 on the substrate 10. Then, the source 20 and the drain 22 are formed on a part of the active layer 26 and a part of the substrate 10. The channel region 24 exists between the source 20 and the drain 22, as shown in FIG. 6.

Figure 7:
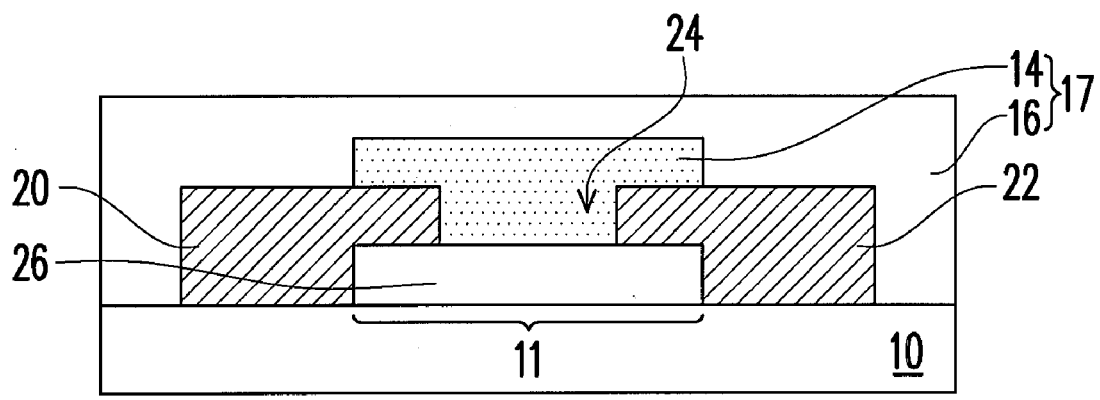

Then, referring to FIG. 7, the inorganic material layer 14 is formed in the active region 11. The inorganic material layer 14 and the dielectric layer 16 form the insulating layer 17 isolating the gate 12 from the active layer 26. Then, the dielectric layer 16 is formed on the inorganic material layer 14, the source 20, and the drain 22.

Figure 8:
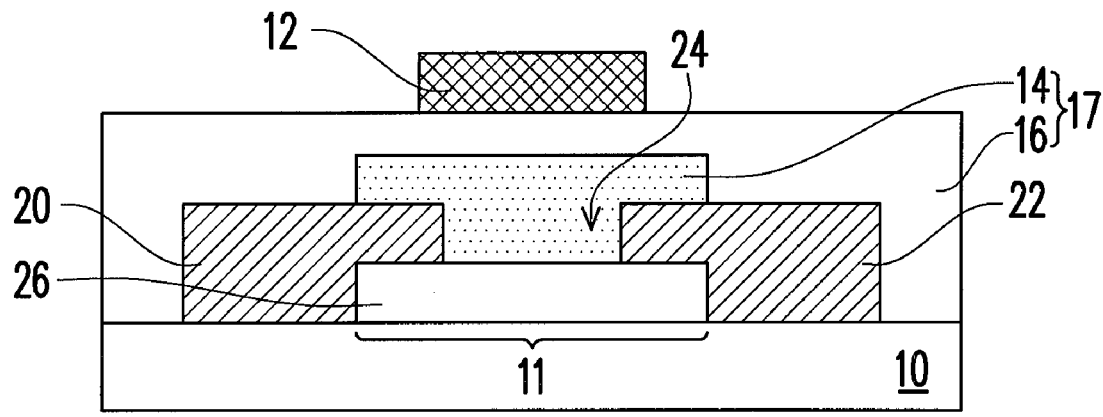

After that, referring to FIG. 8, the gate 12 is formed on the dielectric layer 16 above the channel region 24. Thus, the fabrication of the thin film transistor 100 B with the top gate is completed.

Referring to FIG. 8, in short, the thin film transistor 100 B of this embodiment includes the gate 12, at least an inorganic material layer 14, at least a dielectric layer 16, the source 20, the drain 22, and the active layer 26. The active layer 26 is disposed in the active region 11 on the substrate 10. The source 20 and the drain 22 cover a part of the active layer 26 and a part of the substrate 10. The channel region 24 exists between the source 20 and the drain 22. The inorganic material layer 14 is filled in the channel region 24 between the source 20 and the drain 22, and is coupled to the source 20 and the drain 22. The dielectric layer 16 covers the inorganic material layer 14, the source 20 and the drain 22. The inorganic material layer 14 and the dielectric layer 16 form the insulating layer 17 isolating the gate 12 from the active layer 26. The gate 12 is disposed on the dielectric layer 16.

Figure 8A:
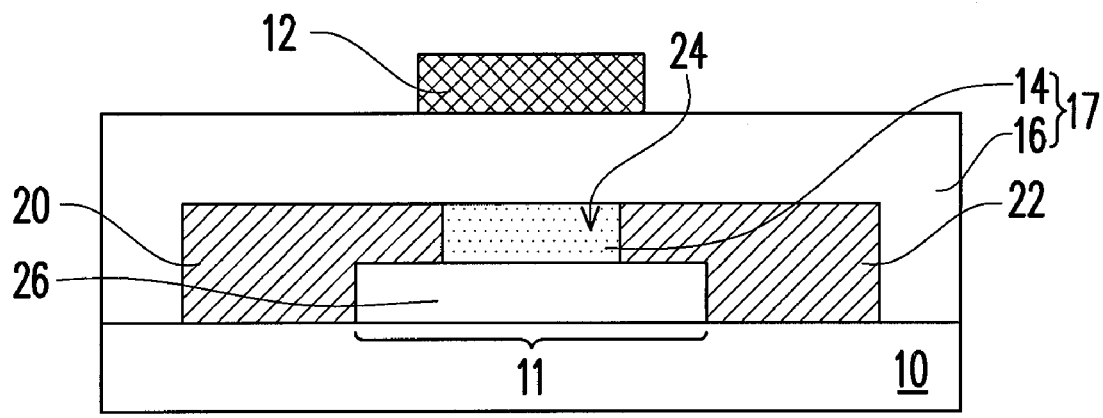
FIGS. 8A and 8H to 8J are schematic cross-sectional views of various top-contact thin film transistors with the top gate according to the embodiments of the present invention.
Figure 8B:
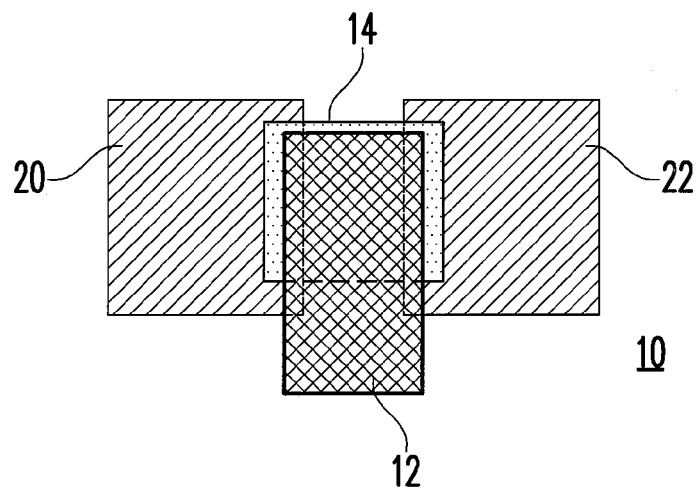
FIGS. 8B to 8G are top views of various top-contact thin film transistors with the bottom gate according to the embodiments of the present invention
Figure 8C:
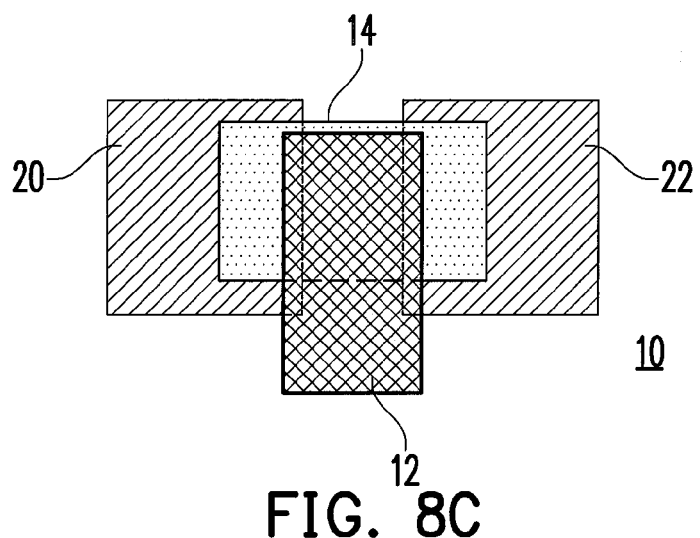
Figure 8D:
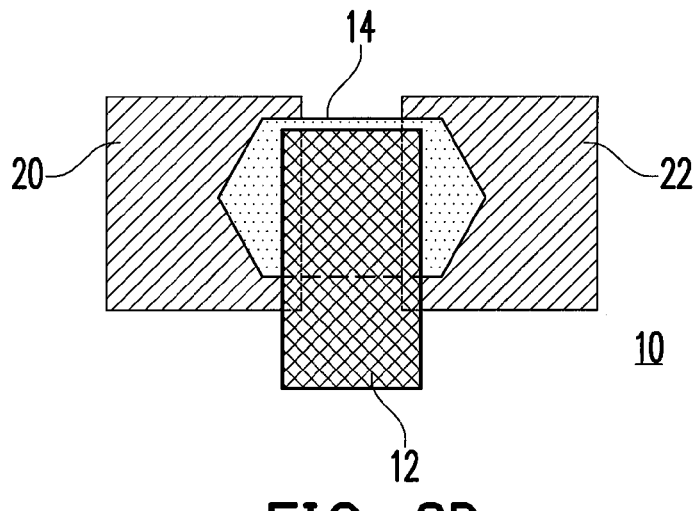
Figure 8E:
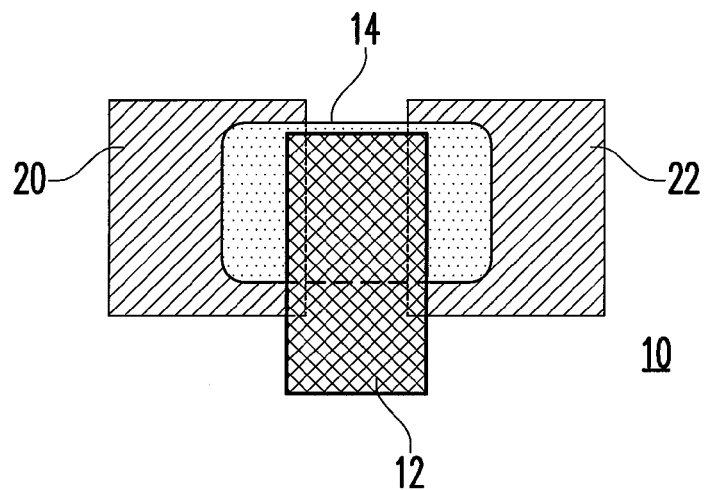
Figure 8F:
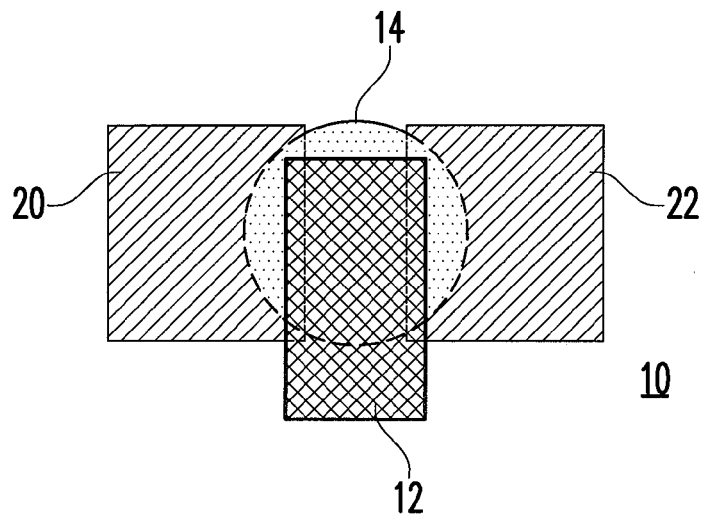
Figure 8G:
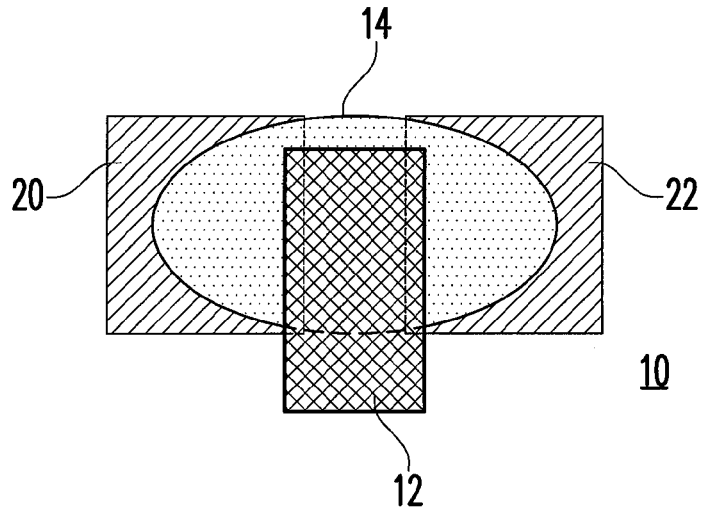

Referring to FIG. 8, in this embodiment, the inorganic material layer 14 is not only disposed in the channel region 24, but also extends to the surface of the source 20 and the drain 22, such that a side of the inorganic material layer 14 is T-shaped. In another embodiment, referring to FIG. 8A, the inorganic material layer 14 is only located in the channel region 24. Furthermore, the profile of the top surface of the inorganic material layer 14 can be square, rectangle, or polygon as shown in FIGS. 8B, 8C, and 8D respectively. Alternatively, to reduce the stress generated by bending, the profile of the top surface of the inorganic material layer 14 can be designed to be curve, such as a square having arc angles, a rectangle having arc angles, a polygon having arc angles, a circle, or an ellipse. FIGS. 8E, 8F, and 8G are top views of the profile of a rectangle having four arc angles, a circle, and an ellipse of the top surface of the inorganic material layer 14 of the thin film transistor respectively. However, the profile of the inorganic material layer 14 is not limited to be so in the present invention, and the profile can be designed to any shape that reduces the stress generated by bending. For the clarity of the figures, the dielectric layer 16 and the active layer 26 are not shown in FIGS. 8B to 8G.

Figure 8H:
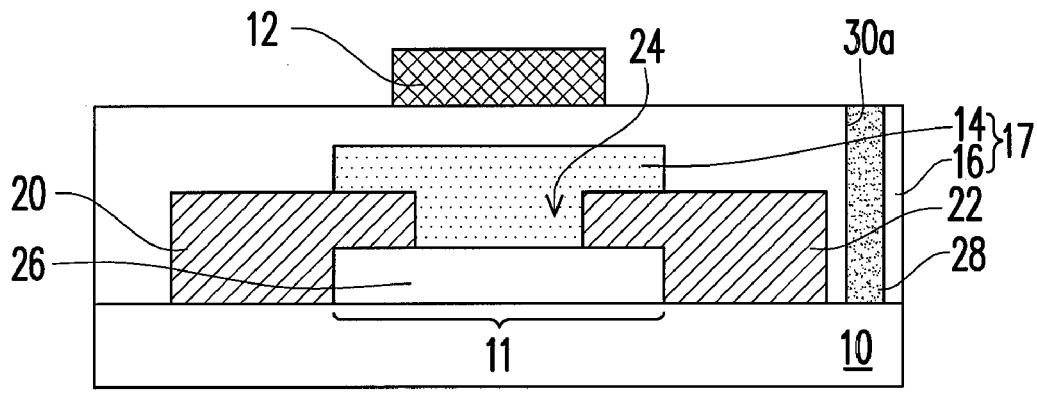
Figure 8I:
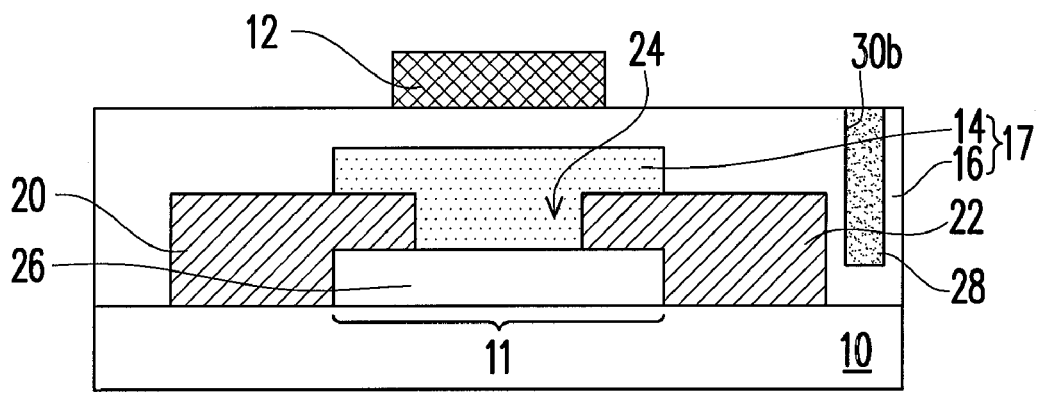
Figure 8J:
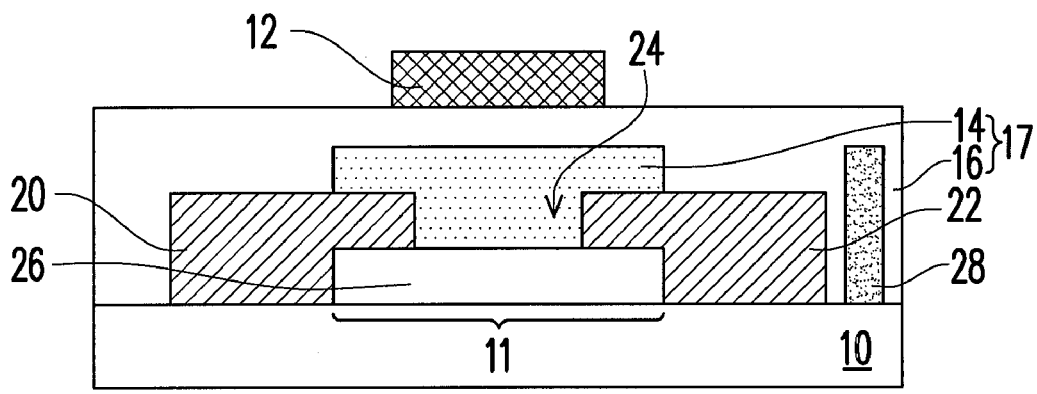

Referring to FIGS. 8H, 8I, and 8J, as such, to further absorb the stress, at least an elastomer 28 can be formed in the dielectric layer 16 outside the source 20 and the drain 22. Referring to FIG. 8H, in an embodiment, the elastomer 28 extends from the bottom surface of the dielectric layer 16 to the top surface of the dielectric layer 16. The method for forming the elastomer 28 of FIG. 8H is for example, forming an opening 30a in the dielectric layer 16. The opening 30a exposing the substrate 10, and then a polymer is refilled in the opening 30a. Referring to FIG. 8I, in another embodiment, the elastomer 28 extends from the top surface of the dielectric layer into the dielectric layer. The method for forming the elastomer 28 of FIG. 8I is for example, forming the opening 30b in the dielectric layer 16. The opening 30b does not expose the substrate 10, and a polymer is refilled in the opening 30b. Referring to FIG. 8J, in another embodiment, the elastomer 28 extends from the bottom surface of the dielectric layer 16 into the dielectric layer 16, but not to the top surface of the dielectric layer 16. The method for forming the elastomer 28 of FIG. 8J is for example, forming a polymer layer on the substrate 10 before forming the dielectric layer 16, then patterning the polymer layer.

The insulating layer of the present invention includes the inorganic material layer and the dielectric layer. The inorganic material layer is disposed between the gate and the active layer. The inorganic material has a dielectric constant greater than that of the organic material, a controllable quality, and fewer defects. Therefore, the formed transistor has less current leakage, and better device characteristics. The dielectric layer is located outside the active region where isolation is needed. Because the dielectric layer contains the organic material having good flexibility, the stress generated by bending of the device can be absorbed by the organic material, so as to reduce the stress on the inorganic material substantially. The dielectric layer may use a material having a low dielectric constant, so the better transistor characteristics and flexibility of the insulating layer are provided. Furthermore, the inorganic material can be patterned as desired to have edges in a curve pattern, and the elastomer can also be disposed in the dielectric layer, so as to further reduce the stress generated by bending.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor, comprising:
   a gate, disposed on a substrate;
   at least an inorganic material, covering the gate;
   at least a dielectric layer, comprising an organic material, covering the substrate, and having an opening exposing the inorganic material layer on the gate;
   a source and a drain, disposed on the dielectric layer and a part of the inorganic material layer exposed by the opening, wherein a channel region exists between the source and the drain; and
   an active layer, disposed in the channel region.

2. The thin film transistor according to claim 1, wherein a material of the inorganic material layer comprising a low dielectric constant material with a dielectric constant lower than 4.

3. The thin film transistor according to claim 1, wherein a material of the inorganic material layer comprises a high dielectric constant material with a dielectric constant higher than 4.

4. The thin film transistor according to claim 1, wherein a material of the inorganic material layer comprises silicon oxide, silicon oxynitride, silicon nitride, aluminium oxide, aluminium nitride, hafnium oxide, hafnium silicon oxide, hafnium lanthanum oxide, or silicon carbide.

5. The thin film transistor according to claim 1, wherein a profile of a top surface of the inorganic material layer is a square, a rectangle, a polygon, a square with arc angles, a rectangle with arc angles, a polygon with arc angles, a circle, or an ellipse.

6. The thin film transistor according to claim 1, wherein the inorganic material layer covers only a top surface of the gate, the inorganic material layer conformally covers the top surface and sidewalls of the gate, or the inorganic material layer covers the top side and the sidewalls of the gate and sides of the inorganic material layer are in a trapezoid shape.

7. The thin film transistor according to claim 1, wherein a material of the dielectric layer comprises a photosensitive material.

8. The thin film transistor according to claim 1, wherein a material of the dielectric layer comprises a non-photosensitive material.

9. The thin film transistor according to claim 1, wherein a material of the dielectric layer comprises polyimide (PI), polyvinyl phenol, polystyrene (PS), acrylic, or epoxy resin.

10. The thin film transistor according to claim 1, further comprising at least a elastomer disposed in the dielectric layer surrounding the source or the drain.

11. The thin film transistor according to claim 10, wherein the elastomer extends from a bottom surface of the dielectric layer to a top surface of the dielectric layer, from the bottom surface of the dielectric layer into the dielectric layer, or from the top surface of the dielectric layer into the dielectric layer.

12. The thin film transistor according to claim 1, wherein the substrate is a rigid substrate or a flexible substrate.

13. A thin film transistor, comprising:
    a source and a drain, disposed on a substrate, wherein a channel region exists between the source and the drain;
    a gate, disposed opposite to the channel region;
    an active layer, disposed opposite to the gate and disposed in an active region of the substrate; and
    an insulating layer, isolating the gate from the source and the drain, comprising:
       at least an inorganic material, at least disposed between the gate and the active layer; and
       at least a dielectric layer, comprising an organic material, and disposed on the substrate outside the active region.

* * * * *